(12) United States Patent
Yamamoto et al.

(10) Patent No.: US 6,579,154 B2
(45) Date of Patent: Jun. 17, 2003

(54) DRY CHEMICAL-MECHANICAL POLISHING METHOD

(75) Inventors: Seiji Yamamoto, Sapporo (JP); Kenetsu Yokogawa, Tsurugashima (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/875,025

(22) Filed: Jun. 7, 2001

(65) Prior Publication Data

US 2002/0037684 A1 Mar. 28, 2002

(30) Foreign Application Priority Data

Sep. 27, 2000 (JP) ......................................... 2000-299105

(51) Int. Cl.$^7$ ................................................ B24B 1/00
(52) U.S. Cl. ........................... 451/41; 451/63; 438/710; 216/67
(58) Field of Search ............................. 451/41, 36, 53, 451/63; 438/691, 692, 706, 710–712, 720; 156/345.1, 345.12, 345.16, 345.25; 216/60, 67

(56) References Cited

U.S. PATENT DOCUMENTS

| | | | | |
|---|---|---|---|---|
| 5,431,769 A | * | 7/1995 | Kisakibaru et al. | ......... 156/345 |
| 5,871,658 A | * | 2/1999 | Tao et al. | ...................... 216/60 |
| 5,945,008 A | * | 8/1999 | Kisakibaru et al. | ........... 216/71 |
| 6,057,245 A | | 5/2000 | Annapragada et al. | |
| 6,089,183 A | * | 7/2000 | Imai et al. | ............... 118/723 E |
| 6,106,683 A | * | 8/2000 | Ohkawa | ................ 204/298.36 |
| 6,284,668 B1 | * | 9/2001 | Imahashi | .................... 438/716 |
| 6,288,357 B1 | * | 9/2001 | Dyer | ..................... 219/121.41 |
| 6,323,132 B1 | * | 11/2001 | Hwang et al. | .............. 438/706 |
| 6,380,092 B1 | * | 4/2002 | Annapragada et al. | ...... 438/706 |
| 6,406,589 B1 | * | 6/2002 | Yanagisawa | ................. 156/345 |

FOREIGN PATENT DOCUMENTS

| | | |
|---|---|---|
| JP | 9-232257 | 2/1996 |
| JP | 2000-40679 | 7/1998 |

* cited by examiner

*Primary Examiner*—Eileen P. Morgan

(57) ABSTRACT

The present invention provides a dry chemical-mechanical polishing method to perform etching in efficient manner. The dry chemical-mechanical polishing method comprises the steps of bringing surface of a polishing specimen retained on a specimen stand 114 into contact with a polishing tool while supplying plasma 106 from a plasma source, moving relative positions of the polishing specimen and the polishing tool and then polishing, and planarizing the surface of the polishing specimen, whereby diameter of the polishing specimen is increased to larger than diameter of the polishing tool, for instance, so that at least a part of the surface of the polishing specimen is exposed to an atmosphere of the plasma during polishing operation.

9 Claims, 11 Drawing Sheets ized surface
DRY CHEMICAL-MECHANICAL POLISHING METHOD

BACKGROUND OF THE INVENTION

The present invention relates a dry chemical-mechanical polishing method for polishing and planarizing surface pattern on a product such as semiconductor wafer.

As one of the processes to manufacture semiconductor integrated circuit, there is a process for planarizing fine surface irregularities (convex and concave portions) on the surface of a semiconductor wafer prior to interconnection process. In this process, a chemical-mechanical polishing (CMP) system is used. This chemical-mechanical polishing system is the same as a general type mechanical polishing system as commonly used except that a solution containing components exerting chemical action to semiconductor wafer is used as a polishing solution. FIG. 4 is a cross-sectional view showing general features of a conventional type chemical-mechanical polishing system. On an output shaft 402 of a motor 401, a rotary tool 403 is mounted. On the surface of the rotary tool, a polishing pad 404 made of a material suitable for polishing is attached. A semiconductor wafer 407 is mounted on a rotary holder 406, which is attached on a rotation shaft 405, and a supply nozzle 409 for supplying a polishing solution 408 is provided above the polishing pad.

In this polishing system, the rotary tool and the semiconductor wafer are rotated and are pressed against the polishing pad, and suspended polishing solution is supplied onto the polishing material via the supply nozzle. As a result, the surface of the semiconductor wafer can be polished.

JP-A-9-232257 discloses a method, which also uses a polishing solution. In this method, however, instead of abrasive grains or powder, a grinding stone comprising abrasive grains buried in a polishing material on the surface of the rotary tool is used. For example, in case an oxide film is polished, a grinding stone is used, which comprises a phenol resin with silicon disulfide, cerium oxide, alumina, etc. of about 0.01 to 1 $\mu$m in grain size buried in it. By this method, the amount of abrasive grains can be reduced.

Further, U.S. Pat. No. 6,057,245 describes a planarizing technique in vapor phase. This method uses plasma, and a polishing pad is at a position opposite to the plasma. Also, abrasive grains are supplied in vapor phase.

All of the conventional wet type polishing method have the following drawbacks. First, running cost required for polishing is high. Large quantity of expensive polishing solution (abrasives and solvent) is used. Moreover, the polishing pad is very susceptible to clogging because of solid slurry. It is necessary to frequently perform conditioning of polishing surface and component replacement, and higher cost is required.

In terms of uniform planarizing from macro viewpoint, the speed on wafer edge is not uniform. Edge exclusion is between 3 mm and 5 mm and is not sufficient for uniform planaring. In terms of uniform planarizing seen from micro viewpoint, polishing selectivity of convex portions on the surface is not strict. As a result, concave portions on the surface are also scraped off. Further, difference between iso-pattern and densi-pattern is found in a range which is not negligible. Further, the interconnect metal may be corroded due to residual chemical substances such as acidic solvent or alkaline solvent during polishing operation because chemical action of the polishing solution is utilized for polishing. When metal component is present on the polished surface, electrochemical corrosion (electrolytic corrosion) may be induced. In such case, abnormal polishing of metal portion may occur. Detailed description will be given now on the electrolytic corrosion. As described in JP-A-2000-40679, when light enters pn junction provided on a silicon substrate, due to photovoltaic effect of silicon, short-circuit current flows through a closed circuit, which is formed by a polishing slurry attached between pn junction terminal formed in a wafer and wherein pn junction terminal is comprised of Cu connected to n-side (−side) of pn junction −pn junction −Cu connected to p side (+side) of the pn junction. From the surface of Cu interconnect connected to p side (+side) of the pn junction, $Cu^{2+}$ ions are dissociated, and this causes electrolytic corrosion. As a result, abnormal polishing occurs on Cu surface.

Because of the structure of the system and the condition of polishing, it is very difficult to detect an end point where removal of the polishing layer is completed, and this leads to difficulty of in-line monitoring. Further, polishing solution and the polishing pad are optimized to a certain type of film material, and it is difficult to continuously polish a wide variety of film types. Further, the conventional polishing methods are generally based on wet process. Even when etching or CVD is performed under vacuum condition, a series of steps are required to take out the product to the atmospheric air and then to return it to the vacuum system. This often leads to the decrease of the throughput. These problems must be overcome, and it is also necessary to prevent damages such as scratches, and to maintain basic polishing performance to produce a flattened surface from the surface with pattern of larger dimension and with pattern of fine dimension.

Further, according to the dry polishing method as described in the above U.S. Pat. No. 6,057,245, the polishing pad is positioned opposite to the plasma, and no special care has been taken on the execution of the etching with high efficiency.

SUMMARY OF THE INVENTION

It is an object of the present invention to provide a dry chemical-mechanical polishing method, by which the etching can be performed with high efficiency.

To attain the above object, the dry chemical-mechanical polishing method according to the present invention comprises the steps of bringing surface of a polishing specimen retained on a specimen stand into contact with a polishing tool while supplying plasma from a plasma source, moving the relative positions of the polishing specimen and the polishing tool and then polishing, and planarizing the surface of the polishing specimen, whereby at least a part of the surface of the polishing specimen is exposed to an atmosphere of plasma during said polishing operation.

In order to lead to such condition that at least a part of the surface of the polishing specimen is exposed to an atmosphere of plasma during polishing operation, size of the surface of the polishing specimen should be made larger than that of the polishing tool. If these two are both designed in circular shape, diameter of the polishing specimen should be made larger than diameter of the polishing tool. In case these two have the same size or when the polishing tool is larger, it should be designed that the polishing tool is protruded from the polishing specimen. In this case, the polishing tool may not be necessarily protruded from the polishing specimen during the polishing operation, but it is preferable that it is always protruded. Also, if it is designed in such manner that holes are provided on the polishing tool and plasma is injected from inside the polishing tool, at least a part of the surface of the polishing specimen is exposed to the atmosphere of the plasma regardless of the size of the polishing specimen or the polishing tool.

To attain the above object, the dry chemical-mechanical polishing method according to the present invention comprises the steps of exposing at least a part of surface of a polishing specimen retained on a specimen stand and adsorbing radicals on the surface of the polishing specimen, bringing polishing means into contact with the surface of the polishing specimen, moving relative position of the polishing specimen and the polishing means, heating convex portions of the surface of the polishing specimen by friction, and polishing said convex portions, and planarizing the surface of the polishing specimen.

In all of the above methods, the polishing atmosphere may be under reduced pressure or below atmospheric pressure, or under pressure higher than the atmospheric pressure. More preferably, the pressure of the polishing atmosphere should be in the range from 1 Pa to approx. 100,000 Pa.

DETAILED DESCRIPTION OF THE PREFERRED EMBODIMENT

Figure 1:
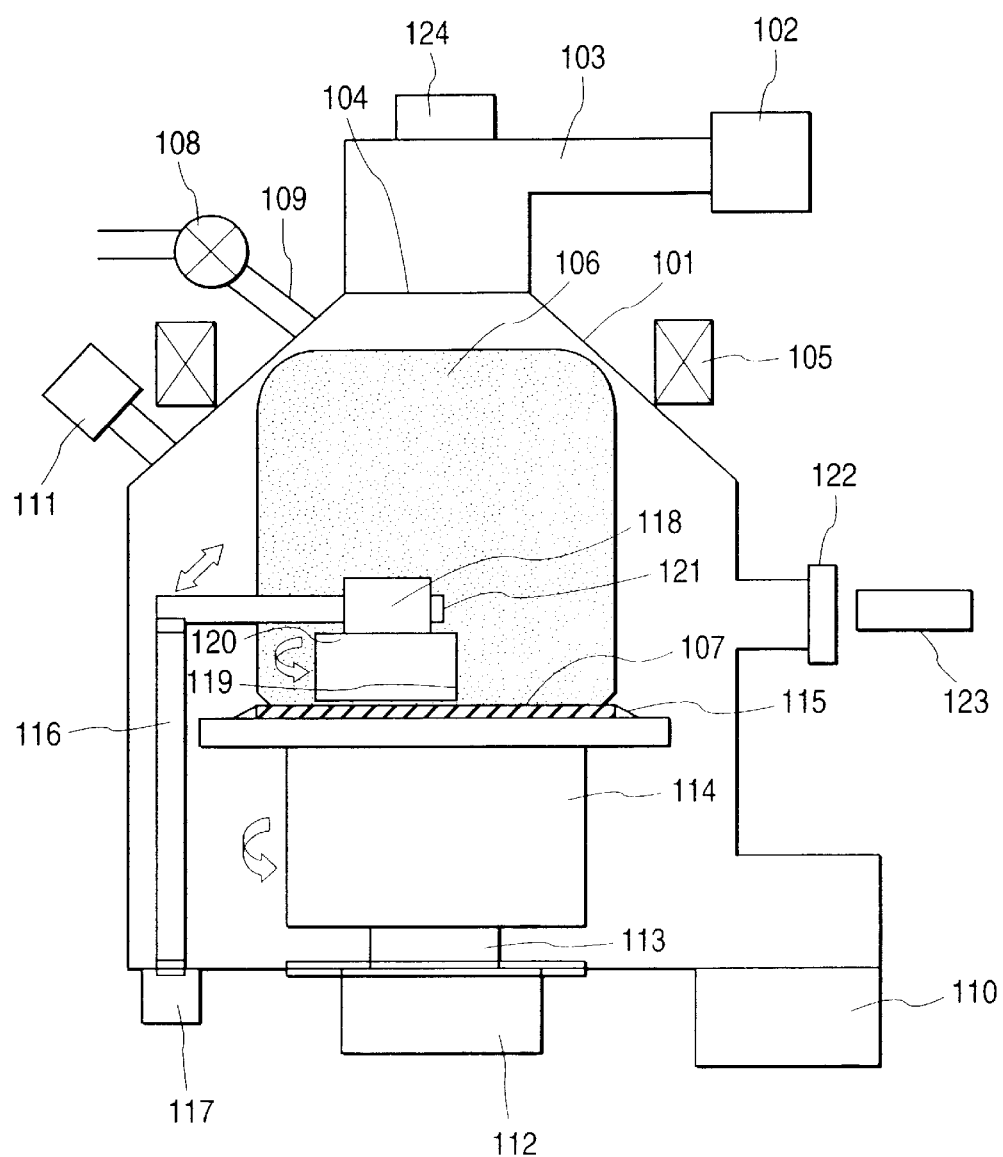
FIG. 1 is a schematic drawing of a dry chemical-mechanical polishing system according to the present invention.

Description will be given below on an embodiment of the present invention referring to FIG. 1. As shown in this figure, according to the present invention, surface irregularities of a semiconductor product are polished using a dry chemical-mechanical polishing system (plasma chemical-mechanical polishing system) 101. This system is an example of polishing systems, which utilize diffusion region of down-flow type plasma. The system comprises a specimen stand 114 with rotating mechanism, a polishing tool for rotation, vibration and translational movement provided with a polishing pad 119 to be selected to match the material of a polishing specimen 107, a plasma generator, a gas supply system, and an exhaust system.

On the plasma generator, microwaves generated from a microwave generator 102 is guided by a wave guide 103, and microwaves are introduced into the system via a dielectric member 104. In the present embodiment, microwaves are used, while the same function can be accomplished when plasma 106 is generated by UHF, radio waves, or by applying magnetic field generated using an electromagnet 105 together with these electromagnetic waves. The injection of fluxes of radicals to the polishing specimen 107 can be optimally controlled for polishing operation by varying the method to introduce electromagnetic waves or the method for applying magnetic field. The gas supply system comprises a valve 108 for controlling flow rate or on-off operation of plasma raw material gas, and a gas supply line 109. The pressure in the system can be reduced by a vacuum exhausting system 110, and the pressure can be constantly monitored and controlled by a pressure gauge 111. The force generated at a driving mechanism 112 is transmitted to the specimen stand 114 via a transmission mechanism 113. Then, the polishing specimen 107 fixed by a specimen fixer 115 is placed on the stand, and it can be rotated, vibrated or moved by translational movement.

Next, the polishing tool will be described. The polishing tool is placed on a support 117, which can be moved by a support driving mechanism 116. This support can be moved in front-to-rear, left-to-right, and top-to-bottom directions, and the position can be controlled. Also, the support is designed in such structure that it can endure application of pressure when the polishing tool is pressed down. On the polishing tool, a polishing pad 119 movable by a polishing drive mechanism 118 is retained on the holder 120. Pressure applied by the polishing tool on the polishing specimen is monitored and controlled by an applied pressure measuring unit 121 such as strain gauge, spring, piezoelectric device, etc.

On the dry chemical-mechanical polishing system, a quartz window 122 is provided, and plasma light can be picked up. End point of the polishing operation can be judged by an end point detector 123, which comprises a spectroscope, and the polishing process can be terminated. By a film thickness gauge 124, film thickness of the surface layer at a point where the polishing tool causes no hindrance is measured, and this can be used for judgment of the end point.

Next, description will be given on an example of planarizing process, in which an oxide film with surface irregularities formed on an upper layer of a semiconductor device is flattened by the polishing method of the present invention. The gas used here is a gas generally used in oxide film etching such as cyclo-$C_4F_8$ (hereinafter referred as "c-$C_4F_8$"), $CHF_3$, $C_5F_8$, etc. In case of c-$C_4F_8$, the gas is preferably supplied at a flow rate of 1–300 ml/min., and it may be diluted with argon gas. It is preferable that the pressure in the system is controlled within the range of 1 Pa to approx. 100,000 Pa. According to each case, gas supply rate may be increased more than the exhaust rate or may be increased to a level higher than 1 atmospheric pressure. The density of plasma is positively correlated with power of electromagnetic waves. Preferably, when the power of 100–1000 W is inputted, a chemisorption layer with a thickness suitable for polishing can be formed. Under this atmosphere of plasma, the polishing pad is pressed against the specimen, and rotational polishing is carried out. As the polishing pad, hard expanded polyurethane, polyurethane or Teflon mixed with abrasives such as silicon dioxide, cerium oxide, alumina oxide, etc., or, polishing pad with oxide film ($SiO_2$ film) formed on the surface is used. The modulus of elasticity of the polishing pad can be adequately selected according to each polishing process. Applied load and rotational speed of the polishing pad are adequately adjusted within such extent that the polishing speed or polishing rate and uniformity as required can be attained.

As an example of the execution of the polishing, there is a case of combination of a load of 0.5 kg/$cm^2$ and rotational speed of 1000 rpm. In general, when the load is not high, the rotational speed is increased. When the load is high, rotational speed is reduced in order to have the same polishing speed. However, if the load is too high, micro scratches are more likely occur on the surface of the polished wafer. In case the polishing specimen is a large-diameter wafer of 200–300 mm in diameter, polishing uniformity on the peripheral portion of the wafer may be decreased. By moving the support of the polishing tool adequately in front-to-rear or left-to-right direction, the contact time of the polishing pad can be adjusted, and polishing uniformity can be improved. That is, the polishing tool is swept so that the part of the surface with relatively more convex portions can be polished more elaborately.

When an oxide film of 1 μm in thickness was polished by the above polishing method, good workability with working speed of 0.3±0.011 μm/min. could be obtained for all patterns with pattern width of 5 mm–0.5 μm. In some cases, deposited fluorocarbon film may remain on the surface at the end of the polishing operation. This can be removed by generating plasma from the raw material gas and by ashing.

In some cases, components on inner wall of chamber may be contaminated. In such case, cleaning can be performed using oxygen or using gas plasma containing oxygen.

Figure 15:
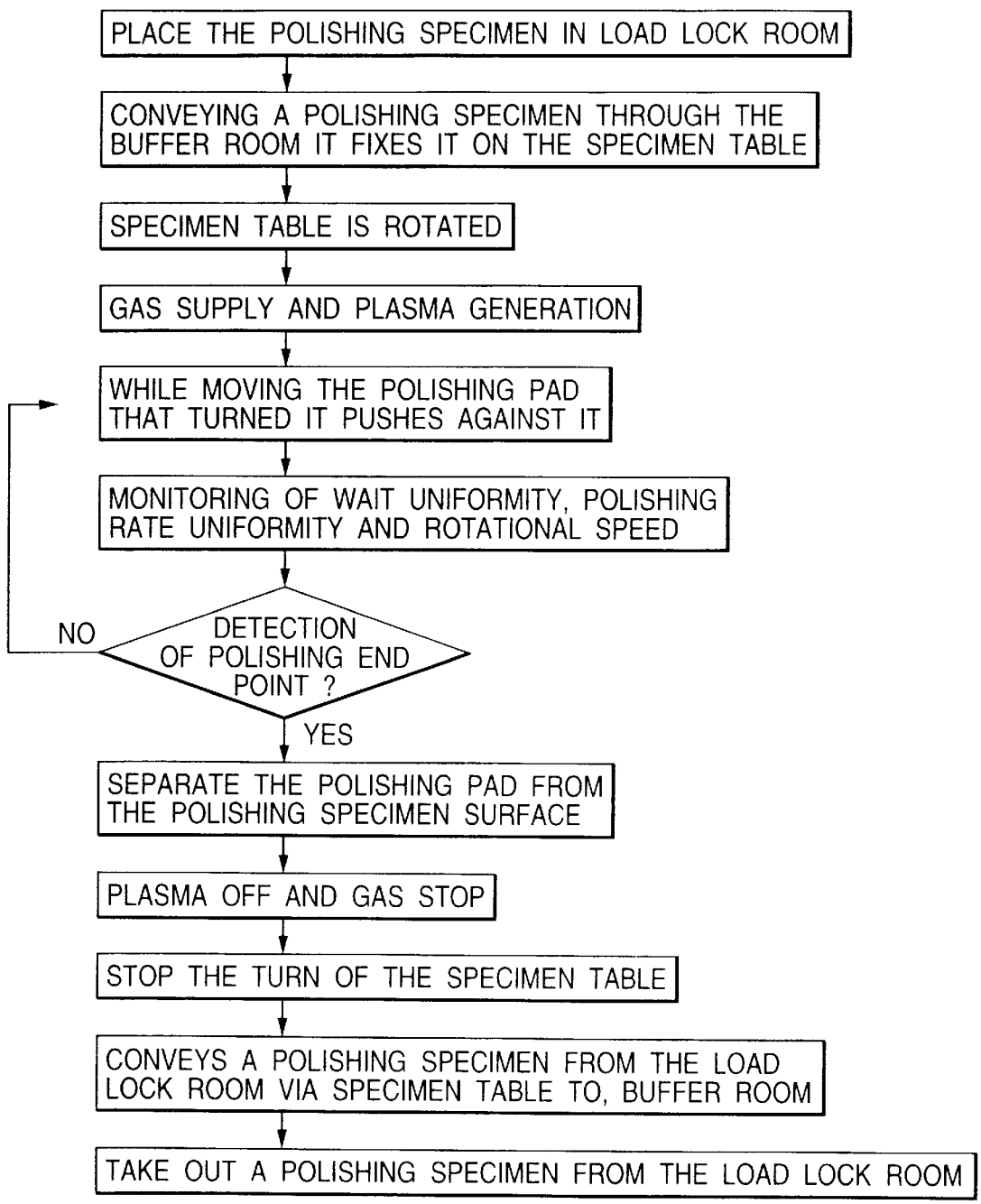
FIG. 15 is a flowchart of processes in the dry chemical-mechanical polishing system of the present invention.

FIG. 15 is a flowchart of the polishing process as described above. The polishing specimen is placed in a load lock room. Then, it is transported via a buffer room, and it is fixed on the specimen stand. The specimen stand is rotated and the gas is introduced, and plasma is generated. By moving the rotary polishing pad, it is pressed against the polishing specimen. Load uniformity, in-plane uniformity and rotational speed are monitored. The end of the polishing operation is determined by photo signal intensity, for instance. When it is judged as the end of the polishing operation, the polishing pad is separated from the polishing specimen. The plasma is extinguished, and gas supply is cut off, and the rotation of the specimen stand is stopped. The polishing specimen is moved from the specimen stand to the load lock room via the buffer room, and it is taken out from the load lock room.

Figure 2:
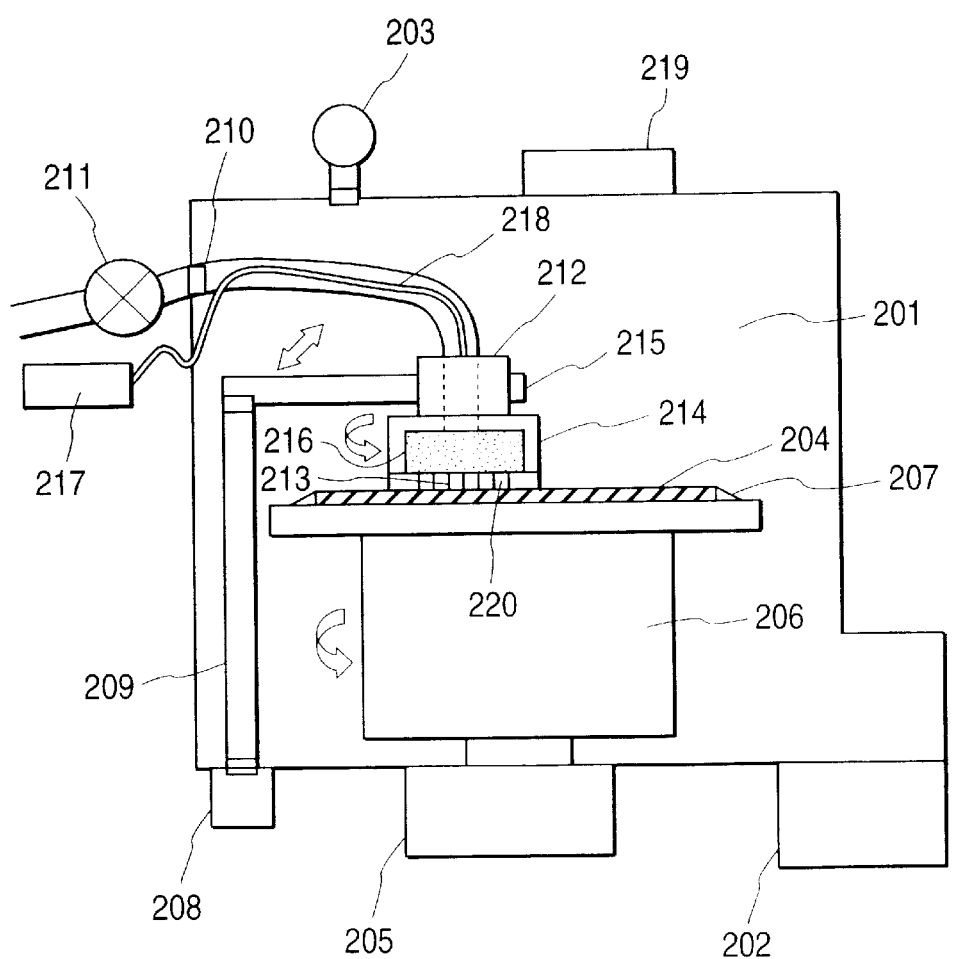
FIG. 2 is a schematic drawing of a dry chemical-mechanical polishing system with another different arrangement according to the present invention.

Next, description will be given on another embodiment of the present invention referring to FIG. 2. According to this embodiment, plasma is generated in the polishing tool, and active radicals are supplied to the surface to be polished. The pressure in a dry chemical-mechanical polishing system 201 is reduced by a vacuum exhausting system 202, and it can be monitored and controlled by the pressure gauge 203. The polishing specimen 204 is fixed by a specimen fixing unit 207 on the specimen stand 206 rotated by a rotary drive unit 205. Next, the polishing tool is placed on a support 209, which can be moved by a support driving mechanism 208. To the polishing tool, a gas supply line 210 is connected, and gas, i.e. raw material of plasma, can be adequately supplied by a flow control system 211. On the polishing tool, a polishing pad 213 is retained on a holder 214, and the polishing pad is operated by a polishing drive mechanism 212, which generates driving force such as rotation, vibration, etc. The pressure applied on the polishing specimen by the polishing tool is monitored and controlled by a pressure gauge 215 such as strain gauge, spring, piezoelectric device, etc. Plasma 216 is generated by transmitting electric power from a radio frequency power supply 217 via a cable 218. When this system is used, the plasma is generated within the holder of the polishing tool. The polishing pad is provided with a plurality of holes 220, and active chemical radicals are supplied to the surface of the polishing specimen via these holes. In a method for generating the plasma on a part of wafer, besides the method to generate plasma in the holder, plasma may also be generated around the polishing tool by providing a discharge mechanism around the polishing pad. Also, film thickness of the surface layer where the polishing tool makes no hindrance can be measured by a film thickness gauge 219, and the result of the measurement can be used for the judgment of the end point. It may be designed in such manner that a quadrupole mass spectrometric system may be provided on the system of the present invention to perform mass spectroanalysis of the radicals in vapor phase and the end point may be detected.

Description will be given now on another embodiment of the invention. In this embodiment, grooves and via holes are formed on oxide film layer by etching, and Cu is buried for surface planarizing. In this case, Cu must also be polished at the same time with the oxide film. For this reason, it is necessary to add $Cl_2$ or HBr together with fluorocarbon gas. Of course, it may be diluted with argon gas. In one example of gas flow rate, it was 10 ml/min. for c-$C_4F_8$, and 5 ml/min. for $Cl_2$. More preferably, the gas is supplied at a flow rate of 1–300 ml/min. and it may be diluted with argon gas. It is preferable that the pressure in the system is controlled within the range of 1 Pa to approx. 100,000 Pa. In some cases, of course, gas supply rate may be increased more than the exhaust rate, and it may be increased to more than 1 atmospheric pressure. Power source for producing the plasma may be in relatively small size, and polishing can be accomplished by simply supplying electric power of about 10–500 W. The polishing pad is provided with several hundreds of holes, each about 1 mm in diameter, and neutral radicals generated in the plasma pass through the holes. As the polishing pad, hard expanded polyurethane, polyurethane mixed with abrasives such as silicon dioxide, cerium oxide, alumina oxide, etc. or polishing pad with oxide film formed on the surface may be used. The modulus of elasticity of the polishing pad can be selected according to each polishing process. Applied load and rotational speed of the polishing pad are adequately adjusted to such extent that the polishing speed and uniformity as required can be attained.

One example of the execution of the above operation is a case of combination of a load of 0.5 kg/$cm^2$ and rotational speed of 1000 rpm. To improve the uniformity, the polishing tool is swept so that polishing operation can be carried out for longer time on the portion with slower polishing speed. When an oxide film with Cu interconnect of 1 μm in thickness was processed by the above polishing method, good polishing workability with working rate of 0.2±0.01

μm/min. could be obtained for all patterns with pattern width of 5 mm–0.5 μm.

This polishing method is also effective when metal interconnect such as copper, aluminum, etc. are polished. Active radicals primarily containing halogen are generated in the plasma, and these are supplied to the polishing surface. The chemical radials react with metal surface, and this increases surface friction coefficient and makes it more easily detachable from the underlying metal. As a result, it is possible to polish metal surface much easier. The detached metal compounds are dissociated in the plasma and are exhausted under vacuum condition. However, at the end of the polishing operation, the plasma is extinguished, and polishing is continued. The polishing is terminated after the affected layer on the surface has been polished.

Figure 3A:
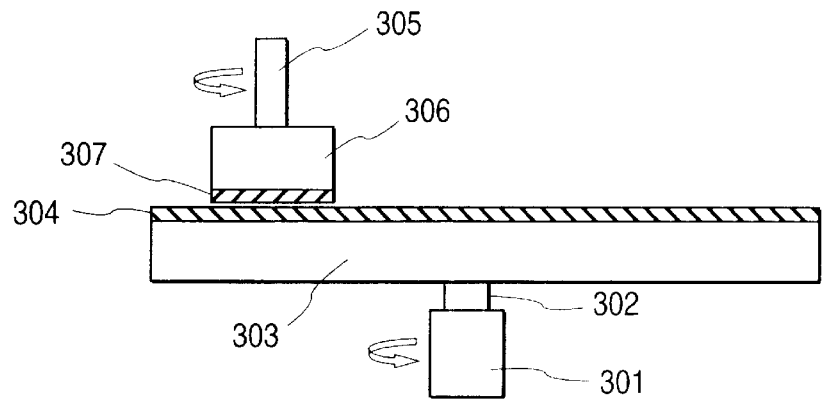
FIG. 3 is a schematic drawing of a dry chemical-mechanical polishing system with still another different arrangement according to the present invention.
Figure 3B:
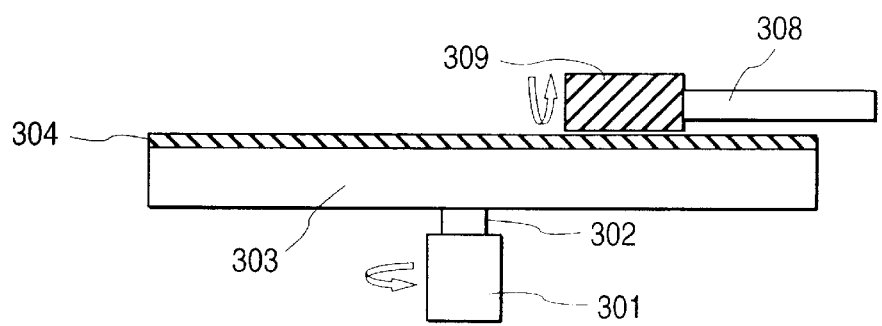
Figure 3C:
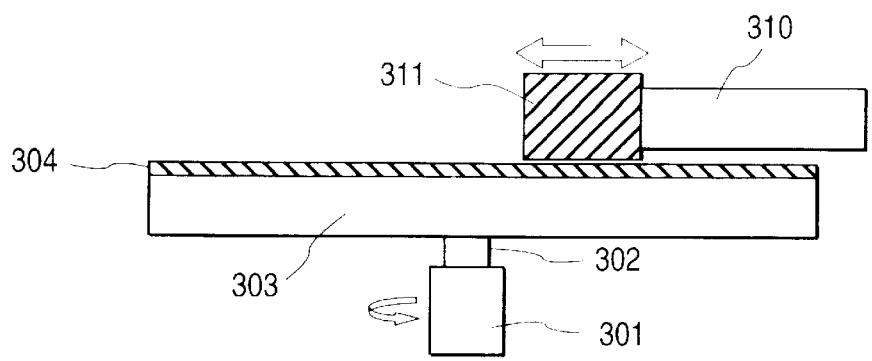
Figure 4:
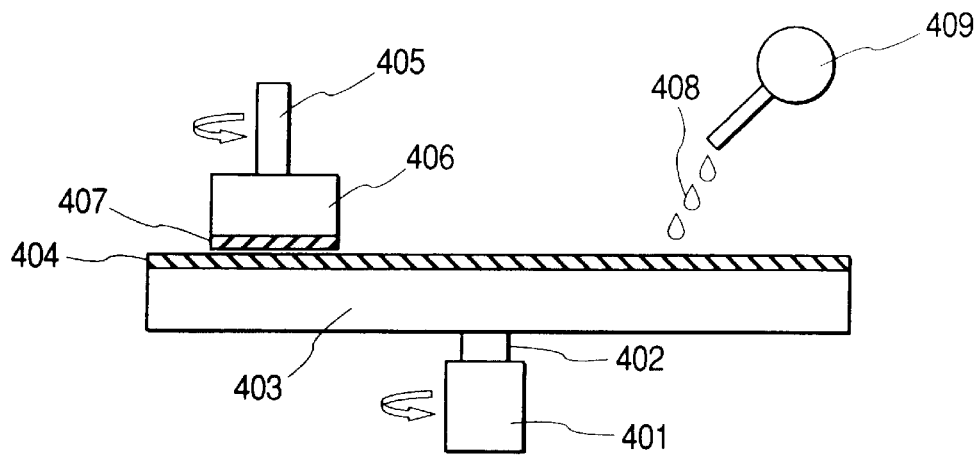
FIG. 4 is a cross-sectional view of a conventional type chemical-mechanical polishing system.

Here, several examples of the polishing methods will be described. As shown in FIG. 3(a), motive power of a rotary drive unit 301 is transmitted via a transmission shaft 302. A specimen stand 303 is rotated, and the polishing specimen 304 is polished. In this case, as in the embodiments described above, polishing is performed by the polishing pad 307 fixed on a holder 306 at the forward end of the driving shaft 305. The rotary polishing is performed horizontally with respect to the specimen to be worked. Next, according to a different polishing method as shown in FIG. 3(b), the motive power of the rotary driving unit 301 is transmitted via a transmission shaft 302, and a specimen stand 303 is rotated and the polishing specimen 304 is polished. In this case, the polishing pad 309 on the forward end of the driving shaft 308 is rotated in a direction shown by an arrow in the figure, and polishing is performed. According to still another method as shown in FIG. 3(c), motive power of the rotary drive unit 301 is transmitted via a transmission shaft 302 and a specimen stand 303 is rotated, and the polishing specimen 304 is polished. In this case, polishing is performed by a polishing pad 311 attached on the forward end of a vibration shaft 310 in horizontal direction. In any of these methods, the polishing tool can control and sweep on the surface of the working surface, and in-plane uniform polishing can be accomplished. Positional relationship between the polishing tool and the polishing specimen may be inversed. The polishing pad has larger area than that of the polishing specimen, while it is important that at least one part of the polishing specimen is exposed to the atmosphere of plasma during the polishing operation.

Major difference between the present invention and the conventional example described in U.S. Pat. No. 6,057,245 lies in the positional relationship between the specimen and the polishing pad. In the conventional example as described above, radicals are primarily adsorbed to the polishing pad. As already described in the conventional example, the mechanism of reaction is such that chemical bonding of the specimen is weakened by friction. Then, the radicals are supplied from the polishing pad, and the reaction advances. In contrast, according to the present invention, the surface of the specimen where the radicals are adsorbed are removed by the heat generated from polishing. The concept of locally generating the plasma as described in the second embodiment is not seen in the conventional example.

Figure 5A:
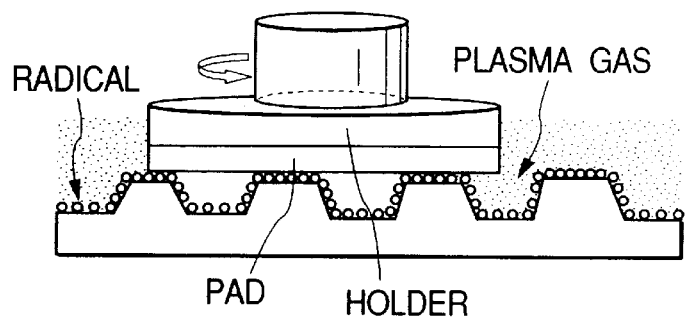
FIG. 5 shows schematic drawings of a holder portion of the dry chemical-mechanical polishing system of the present invention.
Figure 5B:
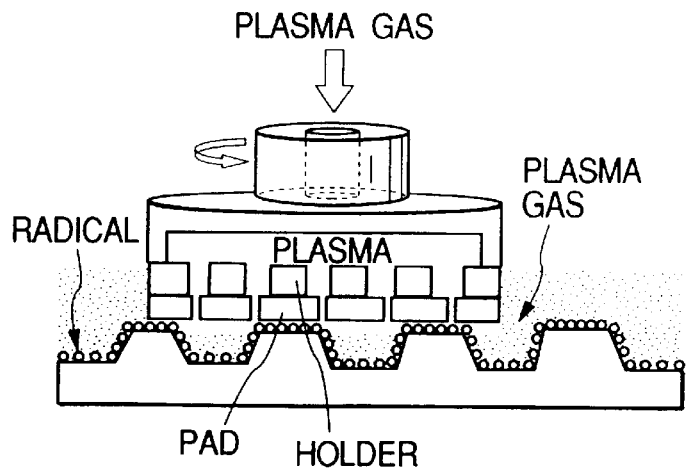
Figure 6:
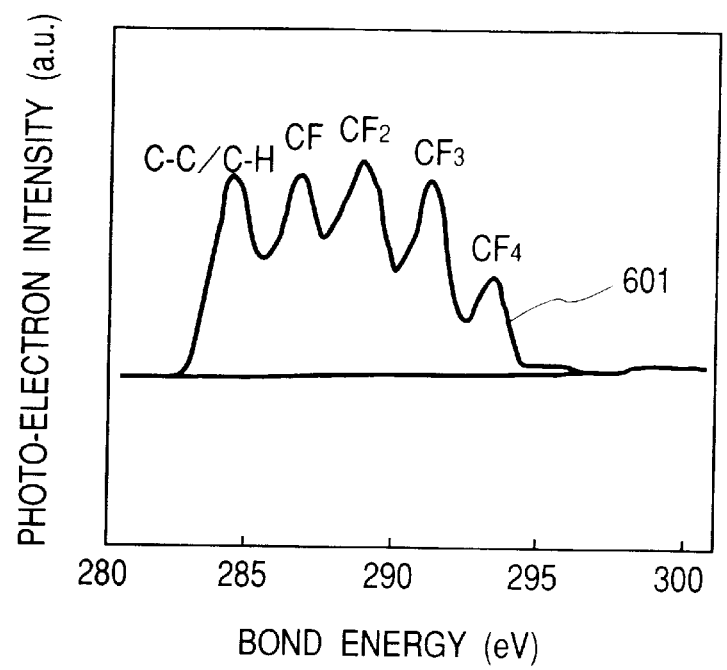
FIG. 6 is a diagram showing X-ray photoelectron spectra on the surface exposed to CF gas plasma.

Now, description will be given on mechanism and principle of polishing in the present invention. FIG. 5(a) and FIG. 5(b) are schematic drawings of the portions around the holder. On each of holders at the forward end of a rotation shaft, a polishing pad is provided. The chemical radicals supplied from the plasma are adsorbed on wafer surface, and a radical adsorption layer is formed. A load is applied on the polishing pad, and it is rotated at high speed and are in contact with convex portions of wafer surface. When the convex portions of the contact surface are selectively polished, the surface is flattened. The products generated from the polishing enter into the plasma, and dissociation proceeds, and these are evacuated under vacuum condition together with other molecules. Taking an example on the surface of oxide film with surface irregularities, description will be given now on the principle of selective polishing of convex portions. It is preferable that the gas used performs chemical reaction with the oxide film and chemical radicals to generate reaction products are generated in the plasma. In the present invention, fluorocarbon gas such as c-$C_4F_8$ is used. This gas is easily dissociated in the plasma, and $C_xF_y$ radicals are generated. These radicals have relatively higher attachment coefficient and are adsorbed to the exposed oxide film surface. As shown by a curve 601 in FIG. 6, which represents signal intensity of X-ray photoelectron to bonding energy of electrons, a plurality of peaks belonging to CF, $CF_2$, $CF_3$, etc. are seen on the surface, and this indicates that CF type adsorption layer really exists. Unless it is a depression such as deep hole with high aspect ratio, there is no substantial difference in adsorption potency between convex and concave portions on the surface, and a surface adsorption layer with equal thickness is formed on the surface irregularities of the surface.

Figure 7:
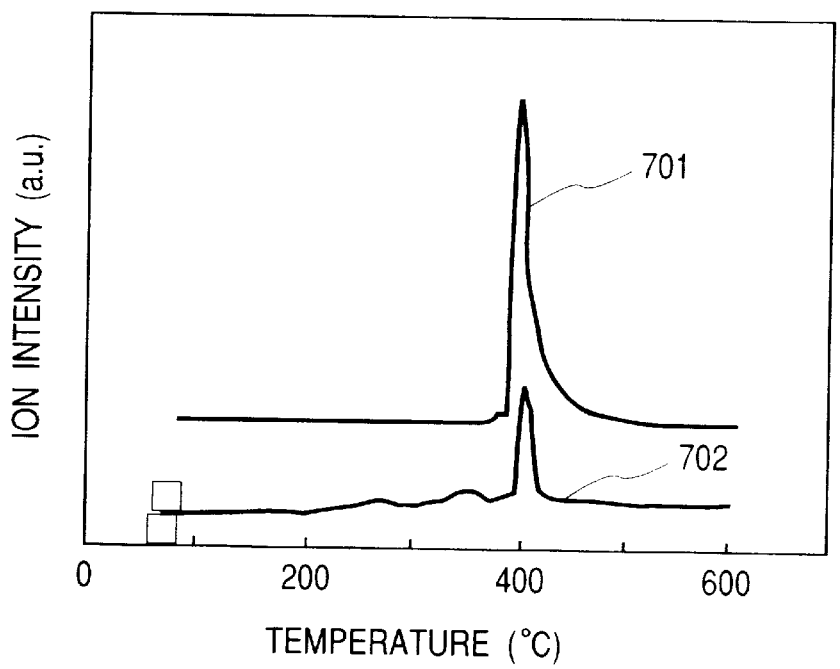
FIG. 7 is a diagram of thermal desorption spectra when desorbed reaction products from the surface attached with CF radicals are detected.

It is not that chemical reaction with the surface spontaneously proceeds simply by adsorption of reactive radicals to the surface. Next, plasma was extinguished, and temperature of wafer where CF adsorption layer was formed on the surface was gradually increased and it was tried to find the temperature, beyond which the chemical reaction occurs. FIG. 7 shows the dependency of ion intensity (i.e. a curve 701 and a curve 702) on wafer temperature. The curve 701 represents signal intensity of $SiF_3$ ions from reaction products as measured by mass spectrometric analysis system, and the curve 702 represents signal intensity of CO ions. Both of these ions are intense at the temperature of about 400° C. When wafer temperature is reached to this range, all of the adsorption layers are subjected to reaction. No matter how the temperature is increased beyond this temperature, no reaction product is detected. Therefore, if heating is performed with wafer surface temperature higher than 400° C., it is evident that chemical reaction proceeds. As an example, if is supposed that one of adsorption chemical radicals is $CF_2$ and reaction products are $CF_4$ and CO. Then, it is given by the chemical formula as given below:

Chemical Formula 1

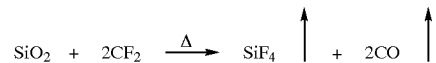

$$SiO_2 + 2CF_2 \xrightarrow{\Delta} SiF_4 \uparrow + 2CO \uparrow$$

When the entire wafer is heated while the plasma is maintained and the radicals are constantly supplied and the above chemical reaction is performed, $SiO_2$ on the surface can be continuously removed by chemical reaction. However, there is no selectivity to convex and concave portions, and the entire oxide film on the surface is made thinner, and the planarizing cannot be achieved.

Figure 8:
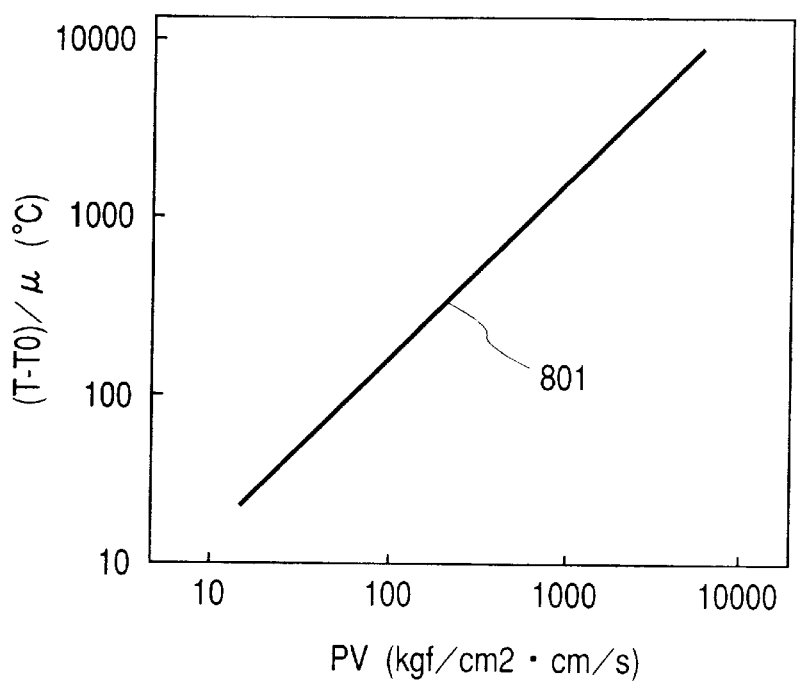
FIG. 8 is a diagram showing correlation between a product of rotational speed of polishing surface with the applied pressure and temperature increase.

In this connection, in order to have selectivity of the surface irregularities, it is necessary to design that only convex portions are heated to the temperature higher than 400° C. Now, description will be given as to whether the contact portion with the polishing pad of the present invention is heated to higher than 400° C. or not. FIG. 8 is a diagram showing the relationship between a product of applied pressure with contact surface speed V and temperature increase (T−T0) when the friction coefficient of contact surface is $\mu$. As shown by the line 801 which represents correlation between the product of applied pressure with polishing speed and contact surface temperature, it is evident that these are in proportional relationship. In case friction coefficient $\mu$ is 0.5, the value of the product PV is about 1000, and this means that temperature increase is about 500° C. That is, in principle, the temperature of convex portions of the surface amply reaches 400° C. or more.

The principle of the present invention will be understood from the above discussion and explanation. In reality, heat transfer differs according to material and pattern of the wafer, and the temperature of wafer surface varies. If temperature control cannot be sufficiently achieved, it is possible to supplementarily adjust the temperature of the entire wafer by a temperature control system such as a heater. The temperature control system may be on the wafer side or on rotating pad side. In this case, special care must be taken that thermal reaction occurs simply due to temperature regulation and the reaction to remove concave portions on the surface should not occur.

Here, description will be given again referring to FIG. 5(*a*) and FIG. 5(*b*). FIG. 5(*a*) shows a schematic drawing of the holder and its surrounding of the first embodiment shown in FIG. 1. The polishing specimen and the polishing pad are closely fitted to each other, and plasma gas reaches only the portion around the polishing pad. However, relative positions of these two components vary, and the plasma gas is also efficiently supplied under the polishing pad. On the other hand, FIG. 5(*b*) is a schematic drawing of holders and the surrounding of the second embodiment shown in FIG. 2. Each holder is provided with a hole of about 1 mm in size. Each polishing pad has innumerable number of holes, each in size of 1 to several mm. In the figure, it looks as if there is one hole on the polishing pad to one hole of the holder. This is only schematically shown. In fact, it depends on the size of the hole of the polishing pad, but usually, 1 to several holes are arranged on the polishing pad to match one hole of the holder. With such arrangement, the plasma gas is injected toward the surface of the polishing specimen. Under the bottom surface of the holder where there is no hole, there are holes on the polishing pad, but the plasma gas does not pass through these holes, and these holes are not shown in the figure.

Figure 12:
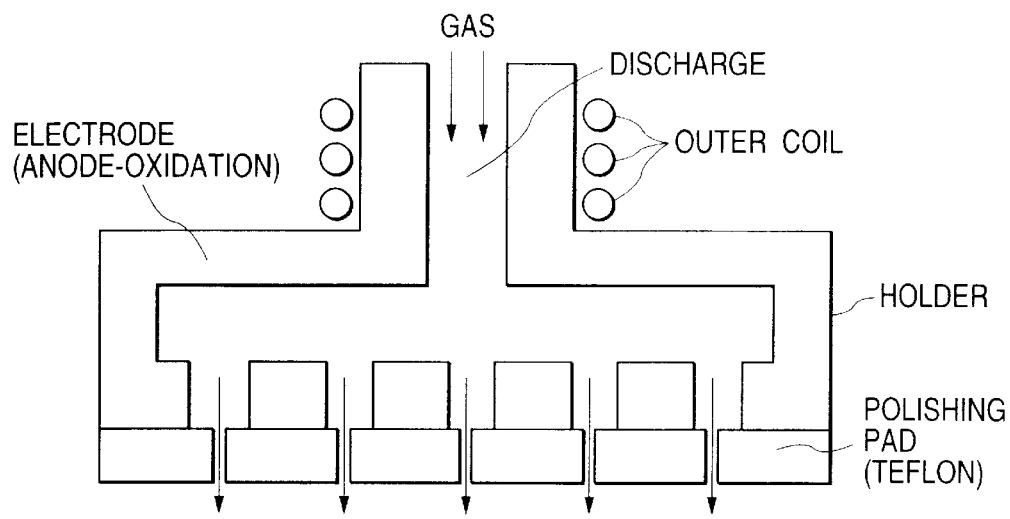
FIG. 12 is a schematic cross-sectional view of the holder portion of the dry chemical-mechanical polishing system of the present invention.
Figure 13:
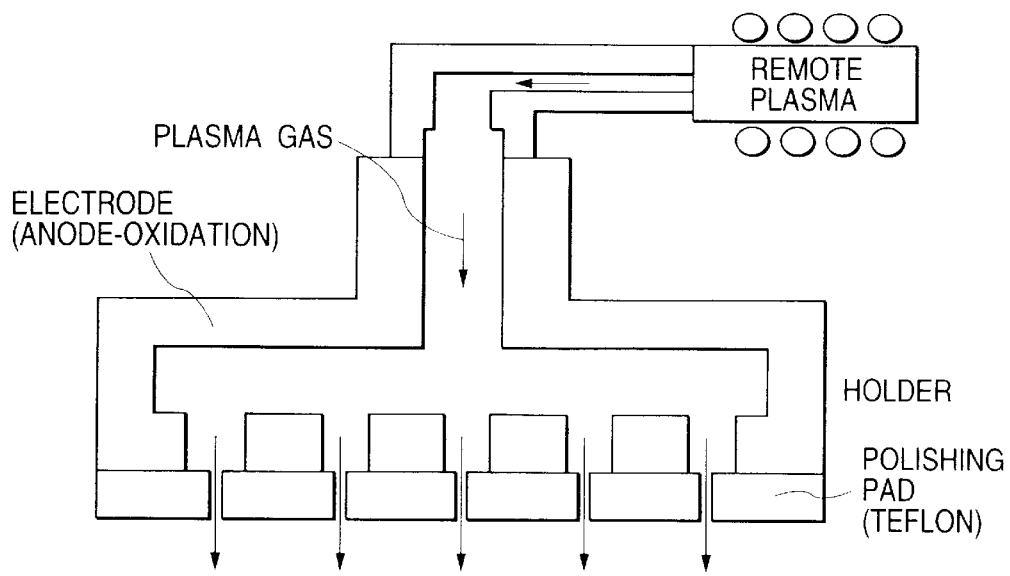
FIG. 13 is a schematic drawing of a dry chemical-mechanical polishing system with another different arrangement of the present invention.

FIG. 12 and FIG. 13 each represents a cross-sectional view of a holder shown in FIG. 5(*b*). As shown in FIG. 12, coil is wound by several turns. Then, radio frequency is applied on the coil, and the introduced gas is generated to plasma. On inner side of the holder, aluminum surface is anodized, and it has anti-corrosive property against plasma. In the holder shown in FIG. 13, the place to generate plasma is different, and the plasma is generated at remote position as remote plasma system. However, if it is too remote, the generated radicals disappear. For this reason, a suitable method must be selected according to the size of the system.

Figure 14:
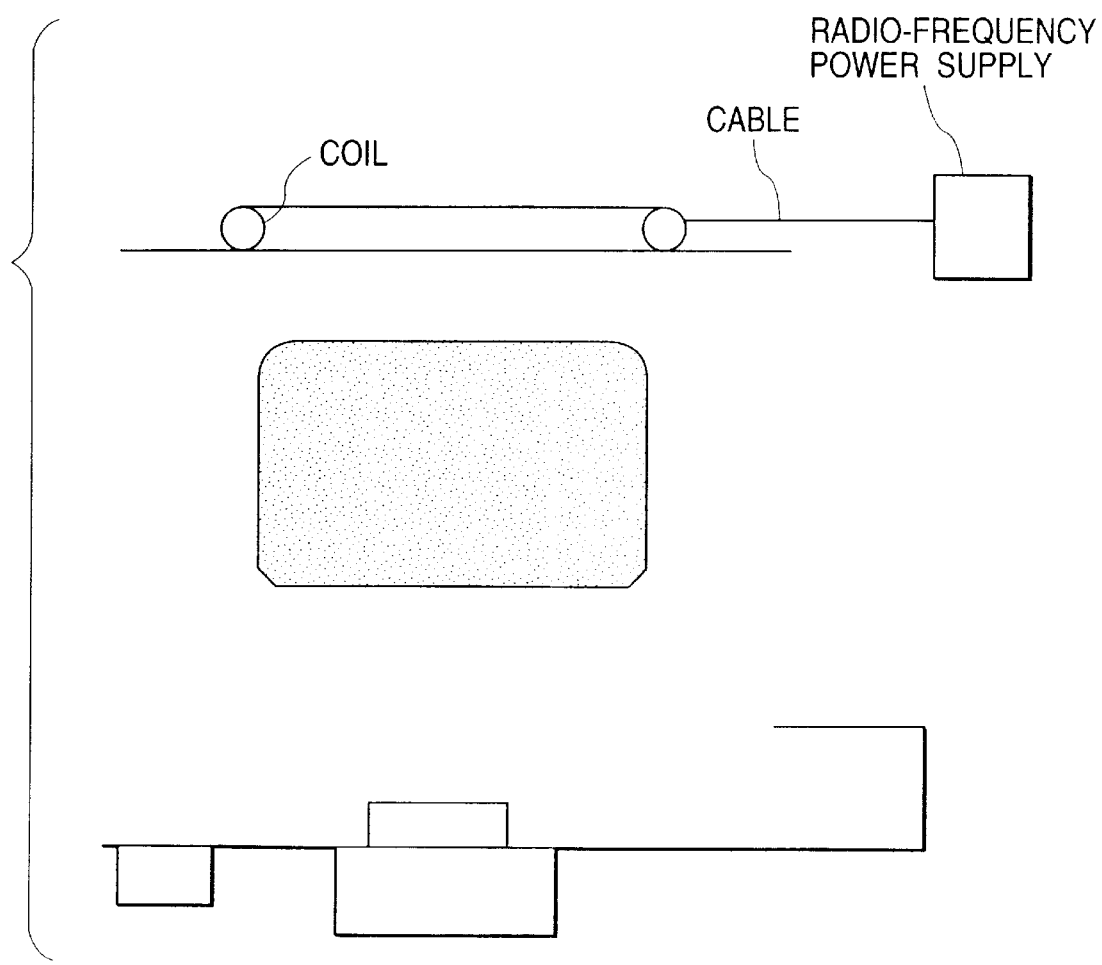
FIG. 14 is a schematic drawing of a dry chemical-mechanical polishing system of atmospheric pressure polishing type of the present invention.

As still another embodiment of the present invention, description will be given below on a dry chemical-mechanical polishing system of atmospheric pressure polishing type referring to FIG. 14. The higher the pressure is, the more the amount of reaction radials is increased, and the higher the polishing speed will be. Radio frequency of 13.56 MHz is applied on the coil, and plasma is generated. According to this method, the plasma can be generated in stable manner even under the pressure higher the atmospheric pressure.

Figure 9:
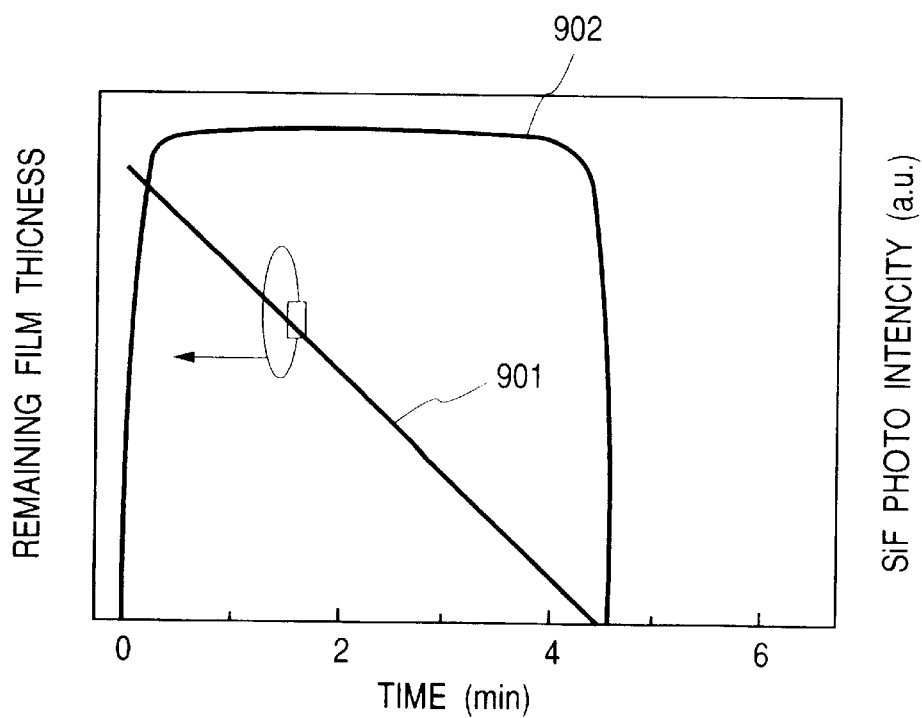
FIG. 9 is a diagram to explain detection of an end point by measurement of plasma light emission.
Figure 10A:
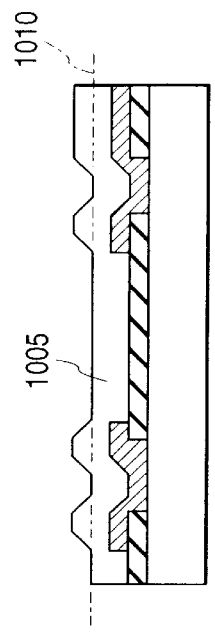
FIG. 10 represents drawings to explain a process for planarizing wafer surface.
Figure 10B:
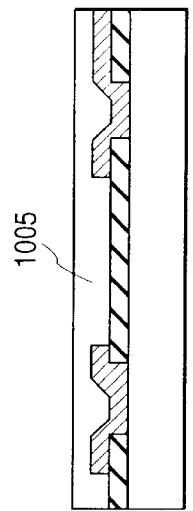
Figure 10C:
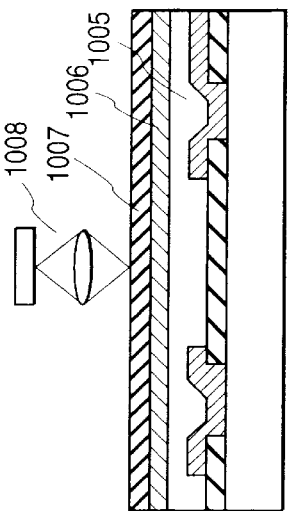
Figure 10D:
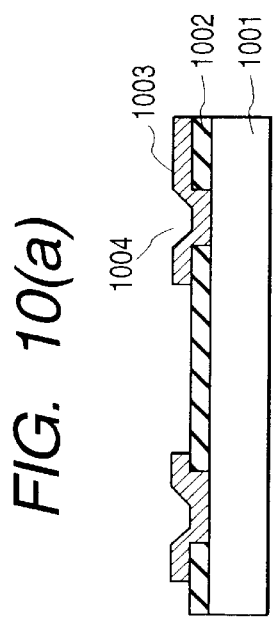
Figure 10E:
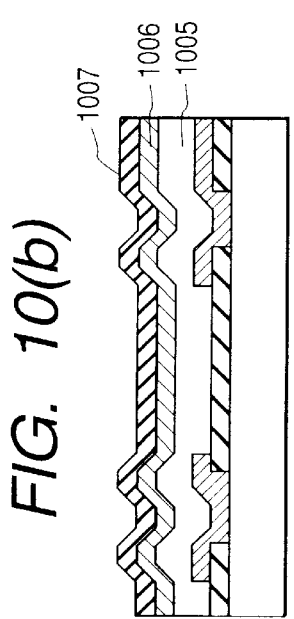
Figure 10F:
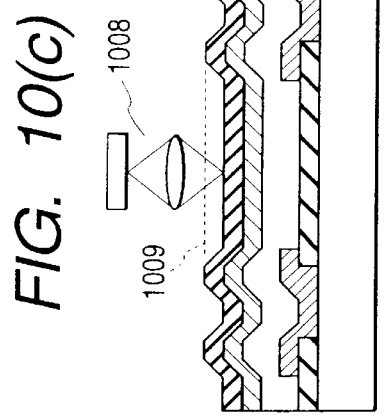

Next, one example of end point detection will be described referring to FIG. 9. To facilitate the explanation, a specimen with $SiO_2$ film grown on a Si substrate is used as the polishing specimen. As shown by the line 901, which represents remaining film thickness of $SiO_2$, the remaining film thickness is decreased as the polishing operation is performed. On the other hand, as shown by a curve 902, which represents photo intensity of SiF, as soon as the polishing is started, photo intensity of SiF rapidly increases. During steady polishing operation, the intensity is maintained almost at constant level. When the underlying Si is exposed, photo intensity of SiF rapidly decreases. When $SiO_2$ is polished and removed completely, it is maintained on the background level. In this way, by monitoring the light emission of the reaction products in the plasma, the end point can be easily determined. Naturally, the end point may also be detected by observing the remaining film thickness of $SiO_2$ using film thickness gauge based on interference method.

Semiconductor manufacturing process consists of a great number of processes. Description will be given below referring to FIG. 10 on interconnection process, i.e. one example of the processes, to which the present invention is applied.

FIG. 10(*a*) is a cross-sectional view of a wafer where a first interconnect layer is formed. On the surface of a wafer substrate 1001 with transistor formed on it, an insulating film 1002 is provided, and an interconnect layer 1003 of Al, Cu, etc. is arranged on it. Because of a contact hole in the insulating film, junction of the interconnect layer is depressed more or less (depression 1004). In an interconnect process of a second layer as shown in FIG. 10(*b*), an insulating film 1005 and a metal layer 1006 are formed on the first layer. Further, a photoresist layer 1007 for light exposure to form an interconnect pattern on the metal layer is arranged. Next, as shown in FIG. 10(*c*), a circuit pattern is transferred by light exposure on the photoresist using a stepper 1008. In this case, if surface irregularities (convex and concave portions) are present on the photoresist surface, there occurs difference of focusing between the concave portions and convex portions on the surface of the photoresist, and this leads to poor resolution.

To overcome this problem, planarizing is performed as follows: After the process shown in FIG. 10(*a*), the insulating film 1005 is formed as shown in FIG. 10(*d*). Polishing operation is performed by the method of the present invention so that planarizing is achieved to the level shown by 1010 in the figure, and it is processed to a condition as shown in FIG. 10(*e*). Then, a metal layer and a photoresist layer are formed, and light exposure is performed using a stepper as shown in FIG. 10(*f*). Under this condition, the photoresist surface is flat, and no problem of poor resolution occurs.

Figure 11:
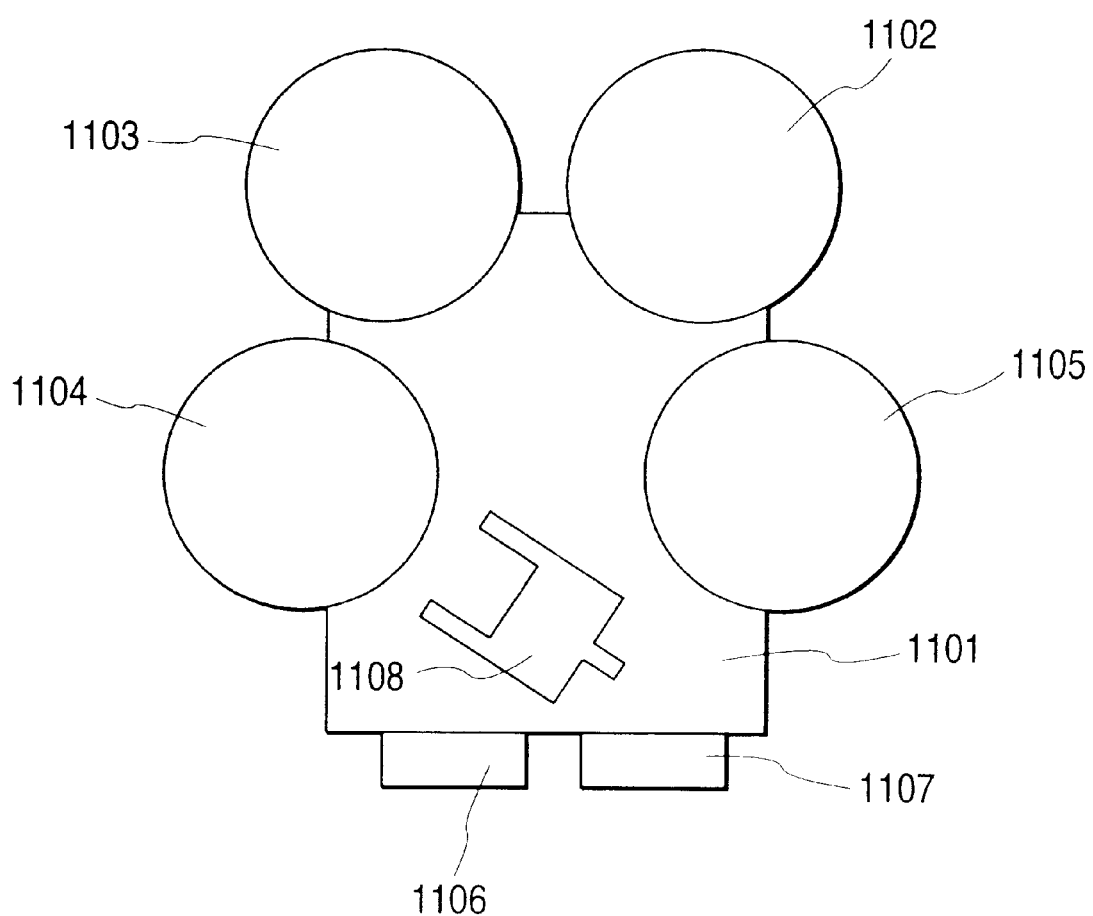
FIG. 11 is a conceptual drawing to show the dry chemical-mechanical polishing system of the present invention with other processing systems in form of clusters.

By adopting the dry chemical-mechanical polishing method of the present invention, it is possible to perform all of the processes, i.e. insulating film forming process, metal interconnect layer forming process, pattern etching process, cleaning process, and polishing process on dry basis. That is, it is possible to build up a total dry process. Referring to FIG. 11, the concept of the total dry process will be explained below. In a multi-process system 1101, there are a plasma etching chamber 1102, a plasma CVD chamber 1103, a dry cleaning chamber 1104, and a dry chemical-mechanical polishing system 1105 of the present invention, and these are arranged in form of clusters. A wafer to be processed is loaded from a wafer loading unit 1106, and it can be moved to each of the process chambers via a transport unit 1107. As a result, it is possible to perform various types of processing such as formation of insulating film by plasma CVD, formation of contact hole by plasma etching, cleaning of wafer surface by dry cleaning, formation of the metal layer by plasma CVD or sputtering, surface planarizing by the dry chemical-mechanical polishing method, and processes such as cleaning and insulating film deposition, etc.—all process under vacuum condition. After the completion of all these processes, the processed wafer can be taken out from the wafer take-out unit 1108.

By this vacuum consistent process, contamination to wafer is decreased, and time loss due to the transport between the processes can be decreased, and this contributes to dramatic improvement of the throughput. Also, no chemical solution is used in the polishing process, and this extremely reduces or eliminates corrosion of the metal layer due to the remaining chemical substances. Basically, contamination level would be on the same level as in case of dry etching. Also, in the total cost, more consumables may be required for polishing unit and this may lead to somewhat higher cost compared with the case of dry etching. However, it is certain that the cost reduction of one digit downward can be achieved compared with the conventional wet type chemical-mechanical polishing.

The present invention can be applied for the manufacture of the products such as semiconductor device, liquid crystal element, micro machine, magnetic disk substrate, optical disk substrate, or optical element.

According to the present invention, it is possible to carry out the polishing process on dry basis and to achieve polishing operation with high efficiency. Also, compared with the wet chemical-mechanical polishing method, the cost for planarizing can be extensively reduced.

What is claimed is:

1. A dry chemical-mechanical polishing method, comprising the steps of:

bringing a surface of a specimen on a specimen plate, said surface of the specimen having at least one convex portion;

bringing said surface into contact with a pad surface of a polishing tool while supplying plasma radicals from a plasma source to the pad surface;

moving said specimen relative to the pad surface of the polishing tool thereby generating a friction between the pad surface and said convex portion of the specimen; and selectively polishing the surface of the specimen by activating the plasma radicals attached on the surface of the specimen with the friction thereby removing said convex portion of the specimen and planarizing the surface of the specimen, whereby at least a part of the surface of the specimen is exposed to an atmosphere of the plasma radicals during said polishing step.

2. A dry chemical-mechanical polishing method according to claim 1, wherein a pressure of the atmosphere for said polishing step is within the range of 0.1 Pa to 100,000 Pa.

3. A dry chemical-mechanical polishing method according to claim 1, wherein a pressure of the atmosphere for said polishing step is below atmospheric pressure.

4. A dry chemical-mechanical polishing method according to claim 1, wherein said plasma is down-flowedly supplied to a down-flow diffusion region then all over the surface of said specimen.

5. A dry chemical-mechanical polishing method according to one of claim 1, wherein said plasma is locally generated at a plasma generation source which is remote form the polishing tool and is supplied to the surface of said specimen through holes provided on the polishing tool.

6. A dry chemical-mechanical polishing method according to claim 1, wherein at least of one of either the specimen or the polishing tool is heated to increase a temperature of a contact portion between the convex portion of the specimen and the polishing pad surface.

7. A dry chemical-mechanical polishing method according to claim 1, wherein a light generated form a reaction product in the atmosphere in the polishing step is detected to determine an end point of the polishing step.

8. A dry chemical-mechanical polishing method, comprising the steps of:

exposing at least a part of a surface with at least one convex portion on a specimen retained on a specimen plate to plasma radicals supplied form a plasma generation source thereby attaching said radicals on the surface of the specimen, said surface of the specimen having at least one convex portion;

bringing a polishing pad surface into contact with the surface of the specimen; and moving the specimen relative to the polishing pad surface thereby heating said convex portion of the surface of the specimen and said attached plasma radicals thereon by friction, and then removing said convex portion so as to planarize the surface of the specimen.

9. A dry chemical-mechanical polishing method according to claim 1, wherein the surface of the specimen is larger than the polishing pad surface.

* * * * *